US010547139B2

(12) United States Patent
Dai et al.

(10) Patent No.: US 10,547,139 B2
(45) Date of Patent: Jan. 28, 2020

(54) ELECTRICAL CONNECTION DEVICE

(71) Applicant: LOTES CO., LTD, Keelung (TW)

(72) Inventors: Yong Jun Dai, Keelung (TW); Zuo Feng Jin, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 16/354,307

(22) Filed: Mar. 15, 2019

(65) Prior Publication Data

US 2019/0214765 A1 Jul. 11, 2019

Related U.S. Application Data

(63) Continuation-in-part of application No. 15/864,189, filed on Jan. 8, 2018, now Pat. No. 10,320,111.

(30) Foreign Application Priority Data

Apr. 24, 2017 (CN) .................... 2017 2 0428993 U

(51) Int. Cl.
*H01R 13/512* (2006.01)
*H01R 12/72* (2011.01)
(Continued)

(52) U.S. Cl.
CPC ....... *H01R 13/512* (2013.01); *H01R 12/7047* (2013.01); *H01R 12/721* (2013.01); *H01R 12/772* (2013.01)

(58) Field of Classification Search
CPC ...... H01R 23/722; H01R 12/79; H01R 12/62; H01R 23/7068; H01R 12/721;
(Continued)

(56) References Cited

U.S. PATENT DOCUMENTS

| | | | | |
|---|---|---|---|---|
| 3,173,737 A * | 3/1965 | Kinkaid | ............... | H01R 13/113<br>439/637 |
| 3,413,594 A * | 11/1968 | Fernald | ................ | H01R 12/727<br>361/787 |

(Continued)

FOREIGN PATENT DOCUMENTS

| | | |
|---|---|---|
| CN | 100416944 C | 9/2008 |
| CN | 204947151 U | 1/2016 |

*Primary Examiner* — Gary F Paumen
(74) *Attorney, Agent, or Firm* — Locke Lord LLP; Tim Tingkang Xia, Esq.

(57) ABSTRACT

An electrical connection device includes an electronic component and a docking component. The electronic component includes a first conductor. The first conductor has a first section and a second section extending forward from the first section. The second section has a contact portion. A width of the contact portion in an extending direction of the second section gradually decreases. The docking component includes a second conductor conductively connected to the first conductor to transmit a high-frequency signal. The contact portion abuts the second conductor. The first section is located behind the second conductor. Thus, the cross-sectional area of the abutting location of the contact portion and the second conductor gradually decreases in the extending direction of the second section. That is, the cross-sectional area of the abutting location of the contact portion and the second conductor gradually decreases relative to the cross-sectional area of the first section.

22 Claims, 20 Drawing Sheets

(51) Int. Cl.
*H01R 12/77* (2011.01)
*H01R 12/70* (2011.01)

(58) Field of Classification Search
CPC .............. H01R 12/772; H01R 12/7047; H01R 13/6215; H01R 13/512
USPC .......................... 439/493, 329, 862, 260, 637
See application file for complete search history.

(56) References Cited

U.S. PATENT DOCUMENTS

| | | | | |
|---|---|---|---|---|
| 4,768,971 | A * | 9/1988 | Simpson | H01R 23/6813 439/329 |
| 4,913,656 | A * | 4/1990 | Gordon | H01R 12/79 439/493 |
| 5,876,214 | A * | 3/1999 | McHugh | H01R 12/721 439/60 |
| 6,183,316 | B1 * | 2/2001 | Morris | H01R 13/26 439/862 |
| 6,767,252 | B2 * | 7/2004 | McGrath | H05K 1/117 439/637 |
| 7,229,315 | B2 * | 6/2007 | Zhang | H01R 13/658 439/607.31 |
| 7,429,179 | B2 * | 9/2008 | Ma | H01R 12/57 439/83 |
| 7,878,870 | B2 * | 2/2011 | Fan | H01R 12/57 439/71 |
| 9,455,530 | B2 | 9/2016 | Patel | |
| 2002/0019179 | A1 * | 2/2002 | Masumoto | H01R 13/2442 439/862 |
| 2006/0276085 | A1 * | 12/2006 | Ma | H01R 13/2442 439/862 |
| 2007/0173137 | A1 * | 7/2007 | Liao | H01R 12/57 439/862 |
| 2007/0264876 | A1 * | 11/2007 | Wan | H01R 13/502 439/637 |
| 2008/0182460 | A1 * | 7/2008 | Fedder | H01R 12/585 439/862 |
| 2010/0087087 | A1 * | 4/2010 | Yeh | H01R 4/023 439/493 |

* cited by examiner

100

A–A

B–B

ELECTRICAL CONNECTION DEVICE

CROSS-REFERENCE TO RELATED APPLICATION

This application is a continuation-in-part of U.S. patent application Ser. No. 15/864,189, filed Jan. 8, 2018, which itself claims priority to and the benefit of, pursuant to 35 U.S.C. § 119(a), patent application Ser. No. 2017/20428993.1 filed in P.R. China on Apr. 24, 2017. The disclosure of the above applications are incorporated herein in their entireties by reference.

FIELD

The present invention relates to an electrical connection device, and in particular to an electrical connection device for high-frequency signal transmission.

BACKGROUND

As shown in FIG. 19 and FIG. 20, an existing electrical connection device 100' includes an electrical connector 200' and a docking connector 300' that are conductively connected to each other. The electrical connector 200' includes a first insulating member 10' and a plurality of first terminals 20' fixed to the first insulating member 10'. Each of the first terminals 20' includes an abutting portion 21' and an extending portion 22' horizontally extending backward from the abutting portion 21'. A width of the abutting portion 21' is equal to a width of the extending portion 22'. The docking connector 300' includes a second insulating member 30' and a plurality of second terminals 40' fixed to the second insulating member 30'. When the electrical connection device 100' is docking, the abutting portion 21' abuts the corresponding second terminal 40' to achieve electrical connection between the electrical connector 200' and the docking connector 300'.

However, since the abutting portion 21' abuts the corresponding second terminal 40' and the extending portion 22' does not abut the corresponding second terminal 40', a cross-sectional area (i.e., S1+S2) of the abutting location of the abutting portion 21' and the second terminal 40' is much different from the cross-sectional area (i.e., S1) of the extending portion 22'. When the electrical connection device 100' is docking, during the transmission process of the high-frequency signal from the extending portion 22' to the second terminal 40' via the abutting portion 21', the high-frequency signal instantaneously generates large fluctuations, which greatly affects the transmission quality of the high-frequency signal.

Therefore, a heretofore unaddressed need to design a new electrical connection device exists in the art to address the aforementioned deficiencies and inadequacies.

SUMMARY

In view of the deficiencies as discussed above, an objective of the present invention is to provide a novel electrical connection device to ensure the quality of high-frequency signal transmission between two conductors that are conductively connected to each other.

To achieve the foregoing objective, the present invention adopts the following technical solutions.

An electrical connection device includes: an electronic component, including a first conductor, wherein the first conductor has a first section and a second section extending forward from the first section, the second section has a contact portion, and a width of the contact portion in an extending direction of the second section gradually decreases; and a docking component, including a second conductor conductively connected to the first conductor to transmit a high-frequency signal, wherein the contact portion abuts the second conductor, and the first section is located behind the second conductor.

In certain embodiments, the second section has a connecting portion located between the contact portion and the first section and connecting the contact portion and the first section, and a width of the connecting portion in the extending direction of the second section gradually decreases.

In certain embodiments, a width of a rear end of the connecting portion is equal to a width of a front end of the first section, a width of a front end of the connecting portion is equal to a width of a rear end of the contact portion, and a thickness of the first section is equal to a thickness of the second section.

In certain embodiments, the first conductor further has a third section extending forward from the contact portion, and the third section is provided in a constant width and abuts the second conductor.

In certain embodiments, the first section, the second section and the third section are located on a same horizontal plane.

In certain embodiments, a width of the third section is ⅓ of a width of the second conductor.

In certain embodiments, the first conductor is located above the second conductor, a pressing member is located above the first conductor, and the pressing member provides a downward acting force such that the contact portion downwardly abuts the second conductor.

In certain embodiments, the docking component is a circuit board, the second conductor is a signal pad, and the docking component has a signal wire and a connecting member electrically connecting the signal wire and the second conductor.

In certain embodiments, the connecting member abuts a front end of the second conductor, and a top surface of the connecting member is flush with a top surface of the second conductor.

In certain embodiments, the second conductor has a first portion and a second portion extending backward from the first portion, a width of the second portion gradually decreases in an extending direction thereof, the contact portion abuts the second portion, and the first portion is located in front of the contact portion.

In certain embodiments, a width of a front end of the second portion is equal to a width of a rear end of the first portion, and a thickness of the second portion is equal to a thickness of the first portion.

In certain embodiments, a width of the first section is less than a width of the first portion, and a thickness of the first section is greater than a thickness of the first portion.

An electrical connection device includes: an electronic component, including a first conductor, wherein the first conductor has a first section and a second section extending forward from the first section, and a width of the second section gradually decreases in an extending direction thereof; and a docking component, including a second conductor conductively connected to the first conductor to transmit a high-frequency signal, wherein the second section abuts the second conductor so as to form a contact surface, a width of the contact surface on the second section gradually decreases, and the first section is located behind the second conductor.

In certain embodiments, the first conductor is located above the second conductor, an elastic body is located above the first conductor and downwardly abuts the first conductor, a pressing member is located above the elastic body and provides a downward acting force such that the first conductor downwardly abuts the second conductor, and when the pressing member presses the elastic body, the elastic body downwardly abuts the second section, and the second section downwardly abuts the second conductor so as to form the contact surface.

In certain embodiments, the electronic component further comprises a third conductor, the third conductor and the first conductor are structurally identical and are provided symmetrically in a vertical direction, the docking component further comprises a fourth conductor, and the fourth conductor and the second conductor are structurally identical and are provided symmetrically in the vertical direction.

In certain embodiments, the electrical connection device further includes: an insulating member, located between the elastic body and the pressing member and downwardly abutting the elastic body, wherein the pressing member downwardly abuts the insulating member; an elastic component, located below the third conductor and upwardly abutting the third conductor; an insulating block, located below the elastic component and upwardly abutting the elastic component; and a pressing component, located below the insulating block and upwardly abutting the insulating block, such that the third conductor upwardly abuts the fourth conductor.

In certain embodiments, the pressing member is a screw bolt and passes through the insulating member and the insulating block from top to bottom, and the pressing component is a screw nut matching with the screw bolt.

In certain embodiments, the first conductor further has a third section extending forward from the second section, and the third section is provided in a constant width and abuts the second conductor.

In certain embodiments, the docking component is a circuit board, the second conductor is a signal pad, and the docking component has a signal wire and a connecting member electrically connecting the signal wire and the second conductor.

In certain embodiments, the connecting member abuts a front end of the second conductor, and a top surface of the connecting member is flush with a top surface of the second conductor.

In certain embodiments, the second conductor has a first portion and a second portion extending backward from the first portion, a width of the second portion gradually decreases in an extending direction thereof, and the second section abuts the second portion so as to form the contact surface.

In certain embodiments, the contact surface comprises a first contact surface and a second contact surface connected to each other, a width of the first contact surface on the second section gradually decreases forward, and a width of the second contact surface on the second section gradually decreases backward.

In certain embodiments, a width of a front end of the second portion is equal to a width of a rear end of the first portion, and a thickness of the second portion is equal to a thickness of the first portion.

In certain embodiments, a width of a rear end of the second portion is equal to a width of a front end of the first portion, and a thickness of the second portion is equal to a thickness of the first portion.

Compared with the related art, certain embodiments of the invention have the following beneficial effects:

The first section is located behind the second conductor and does not abut the second conductor, and the width of the contact portion in the extending direction of the second section gradually decreases. The contact portion abuts the second conductor so as to form the contact surface, and the width of the contact surface on the second section gradually decreases, such that a cross-sectional area of the abutting location of the contact portion and the second conductor gradually decreases in the extending direction of the second section. That is, the cross-sectional area of the abutting location of the contact portion and the second conductor gradually decreases relative to a cross-sectional area of the first section, thereby ensuring that, in a process where the high-frequency signal is transmitted from the first section to the second conductor via the second section, the high-frequency signal fluctuates more gently, instead of fluctuating instantaneously and severely, thus improving the transmission quality of the high-frequency signal.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION

Figure 1:
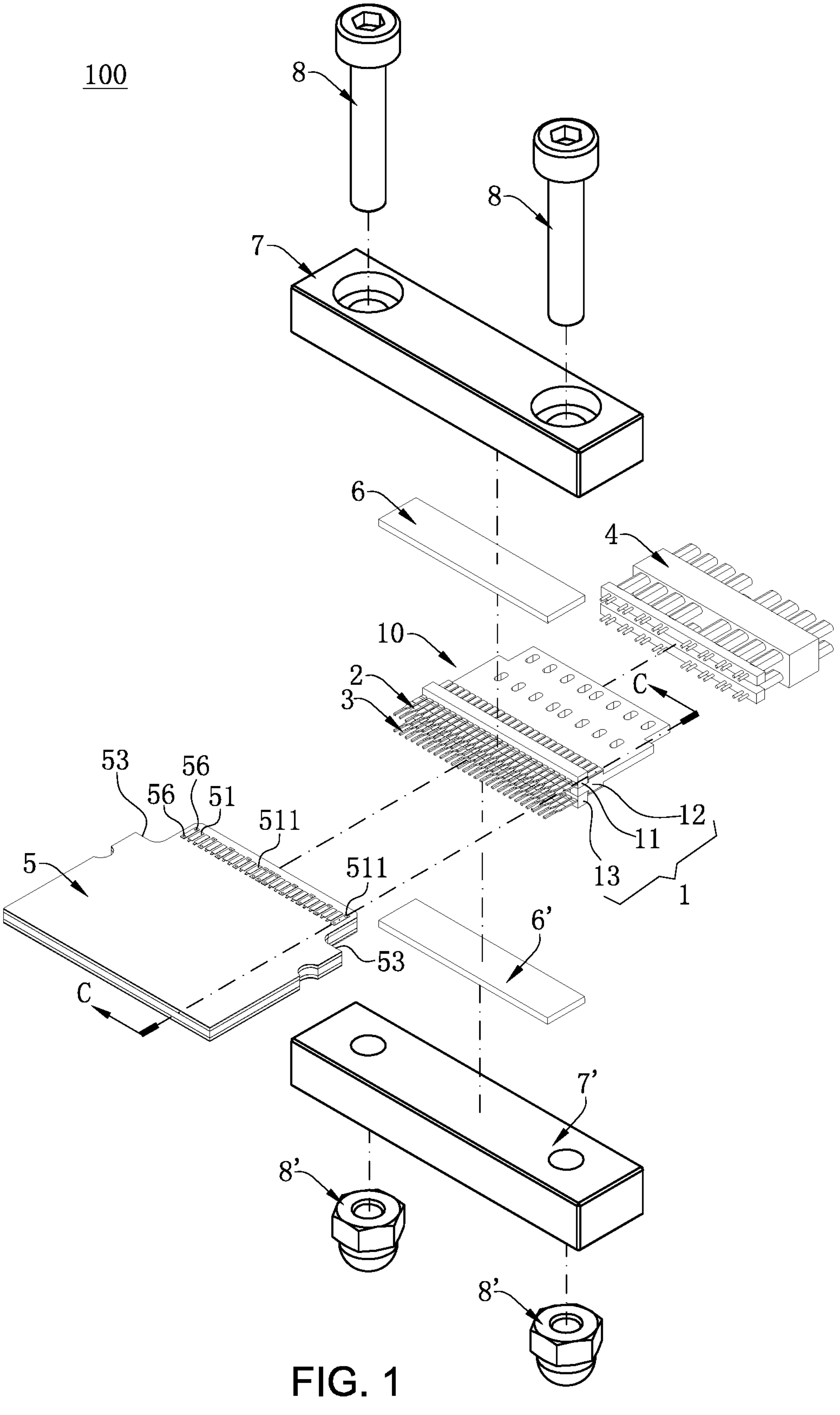
FIG. 1 is a three-dimensional exploded view of an electrical connection device according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated. As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-20. In accordance with the purposes of this invention, as embodied and broadly described herein, this invention, in one aspect, relates to an electrical connection device.

Figure 4:
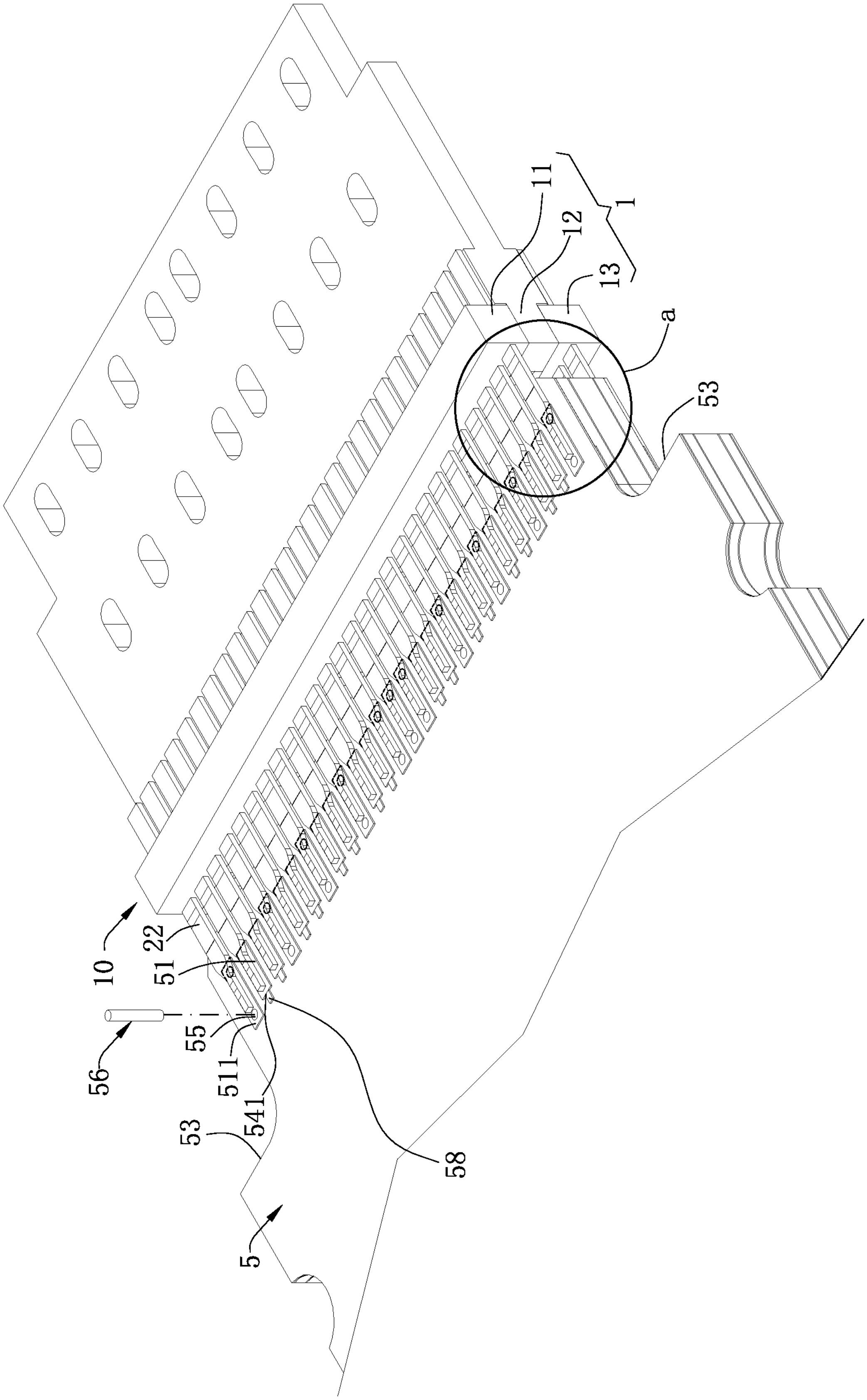
FIG. 4 is a local three-dimensional view of the electrical connection device according to the first embodiment of the present invention.
Figure 12:
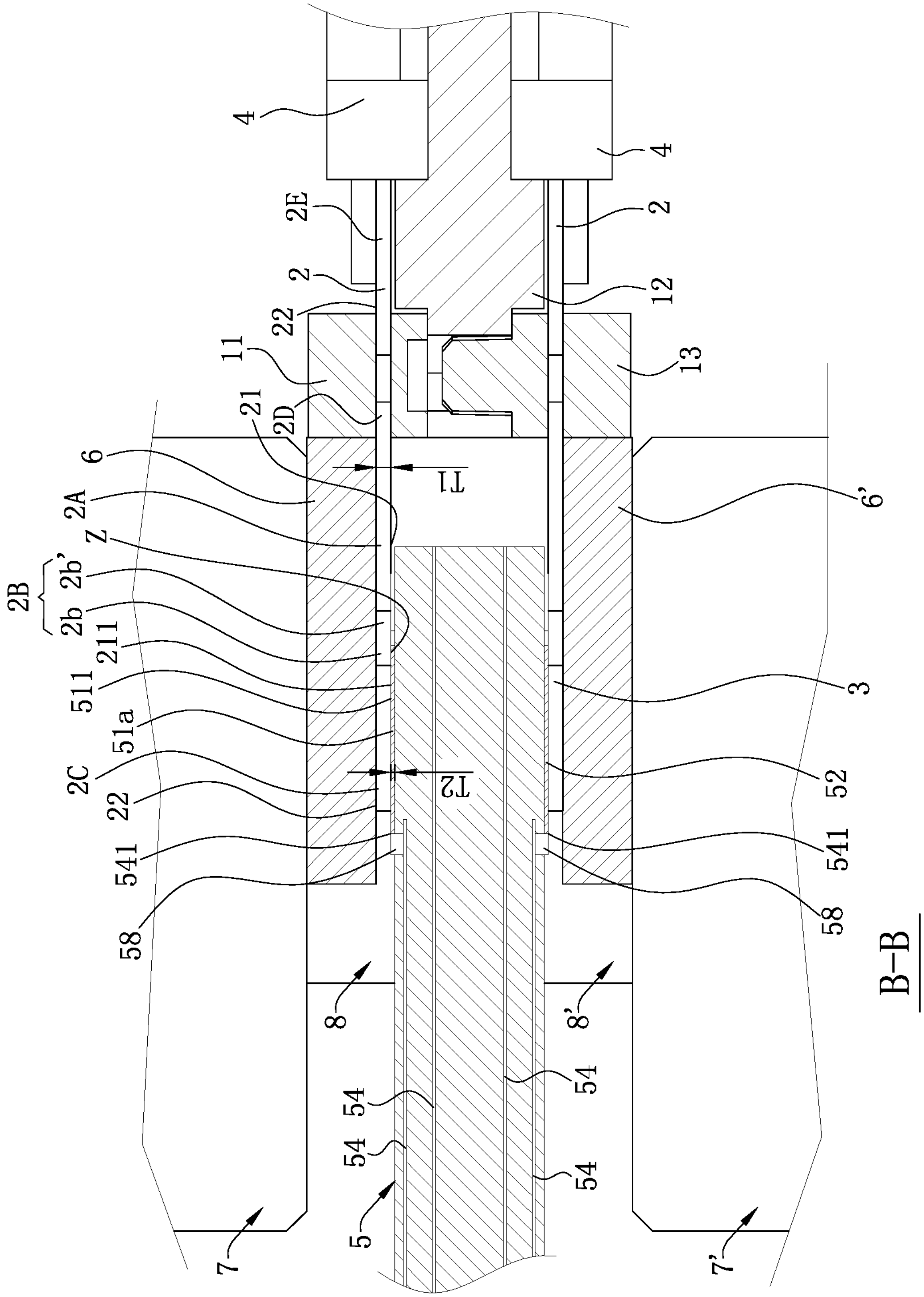
FIG. 12 is a side sectional view of the electrical connection device according to the first embodiment of the present invention along a B-B direction.
Figure 13:
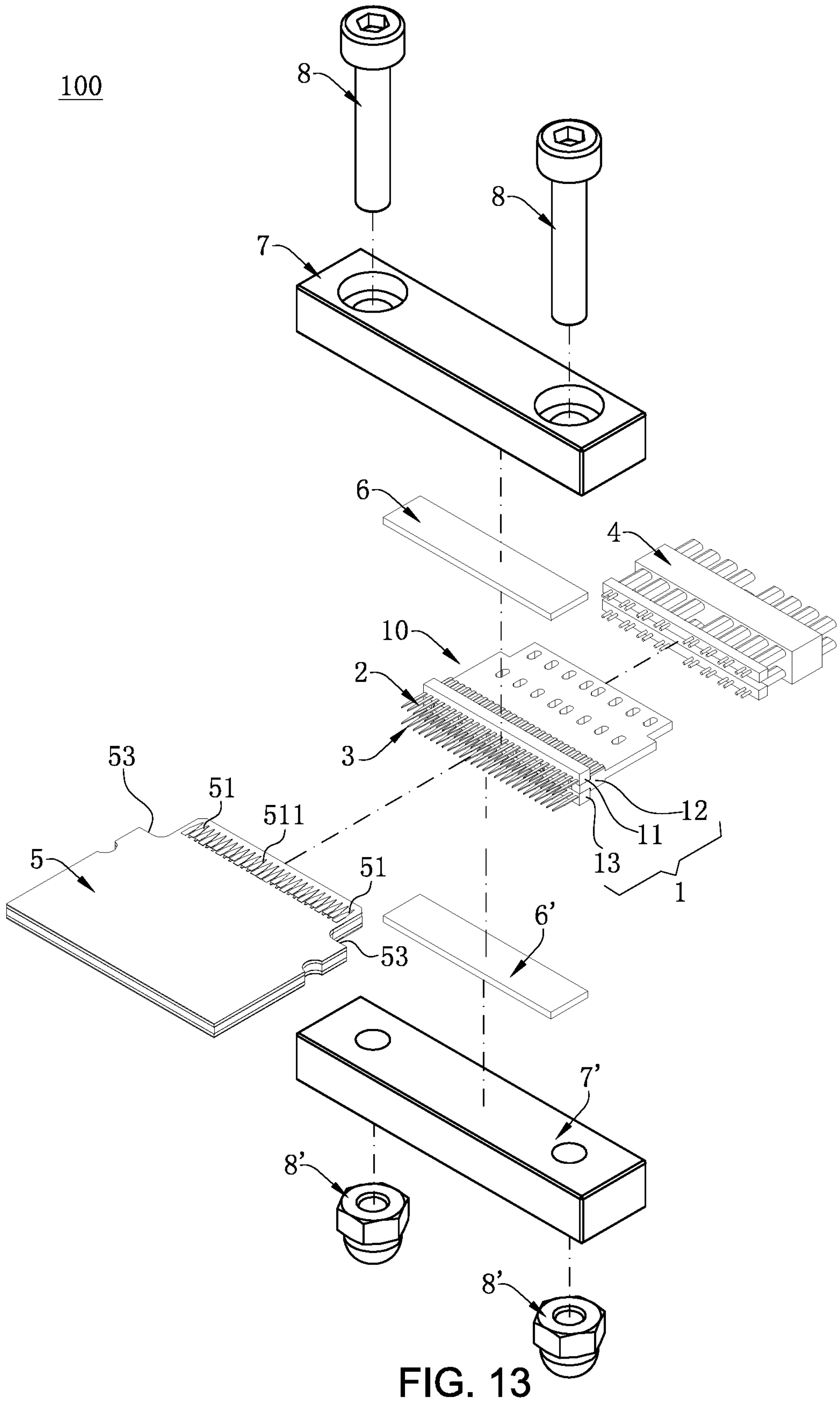
FIG. 13 is a three-dimensional exploded view of an electrical connection device according to a second embodiment of the present invention.
Figure 14:
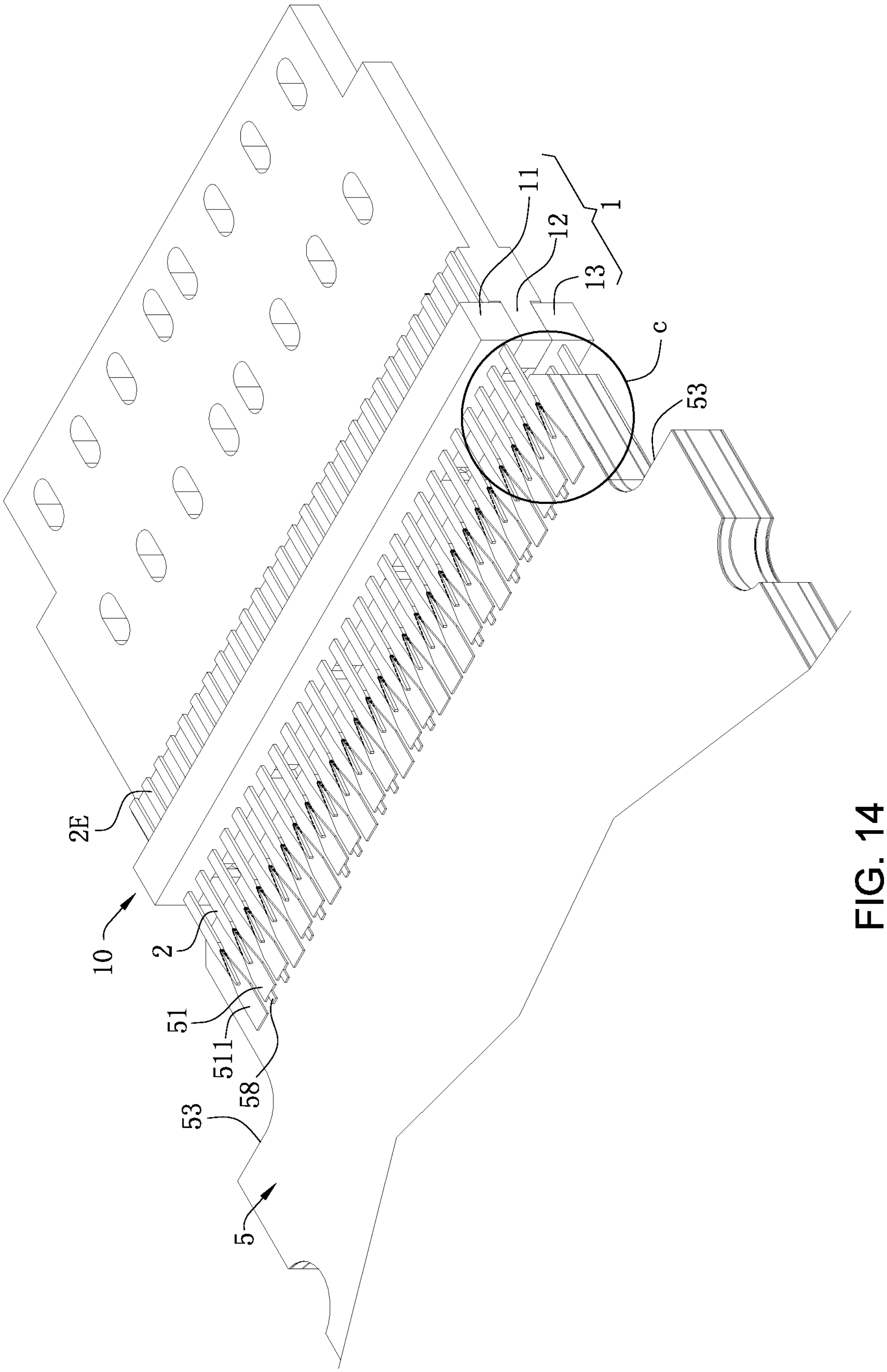
FIG. 14 is a local three-dimensional view of the electrical connection device according to the second embodiment of the present invention.
Figure 15:
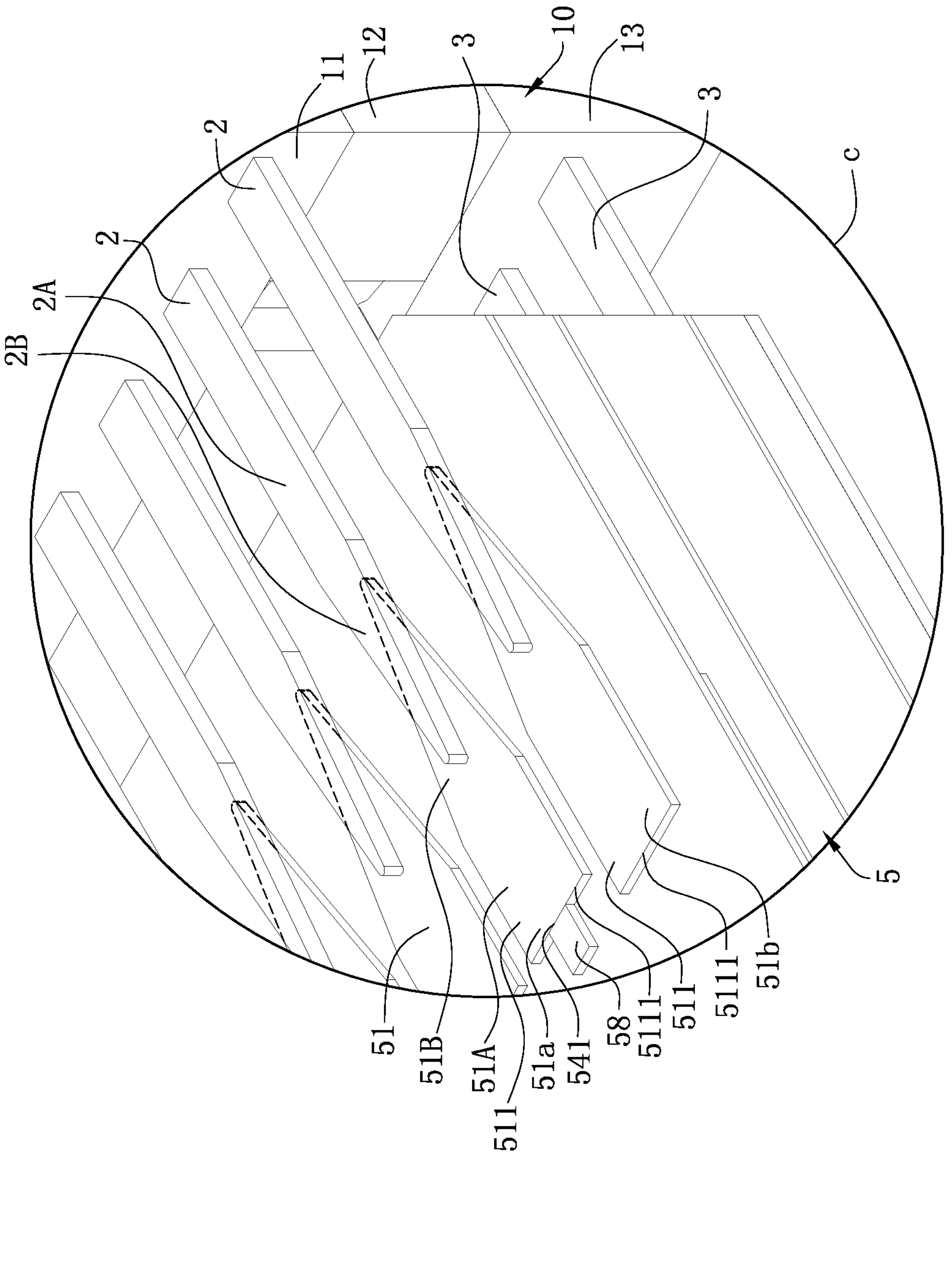
FIG. 15 is an enlarged view of a part c in FIG. 14.
Figure 16:
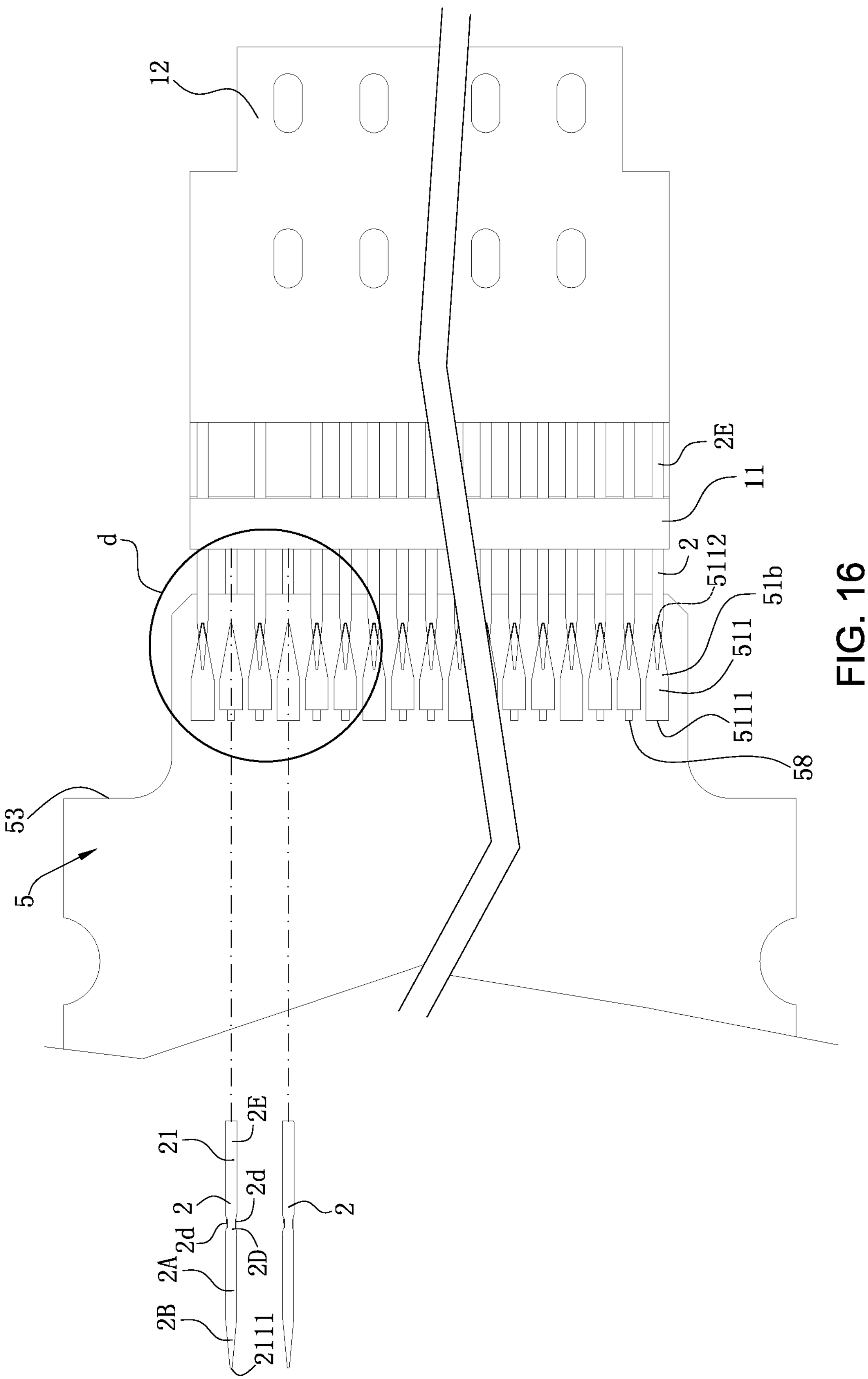
FIG. 16 is a local top view of the electrical connection device according to the second embodiment of the present invention.
Figure 17:
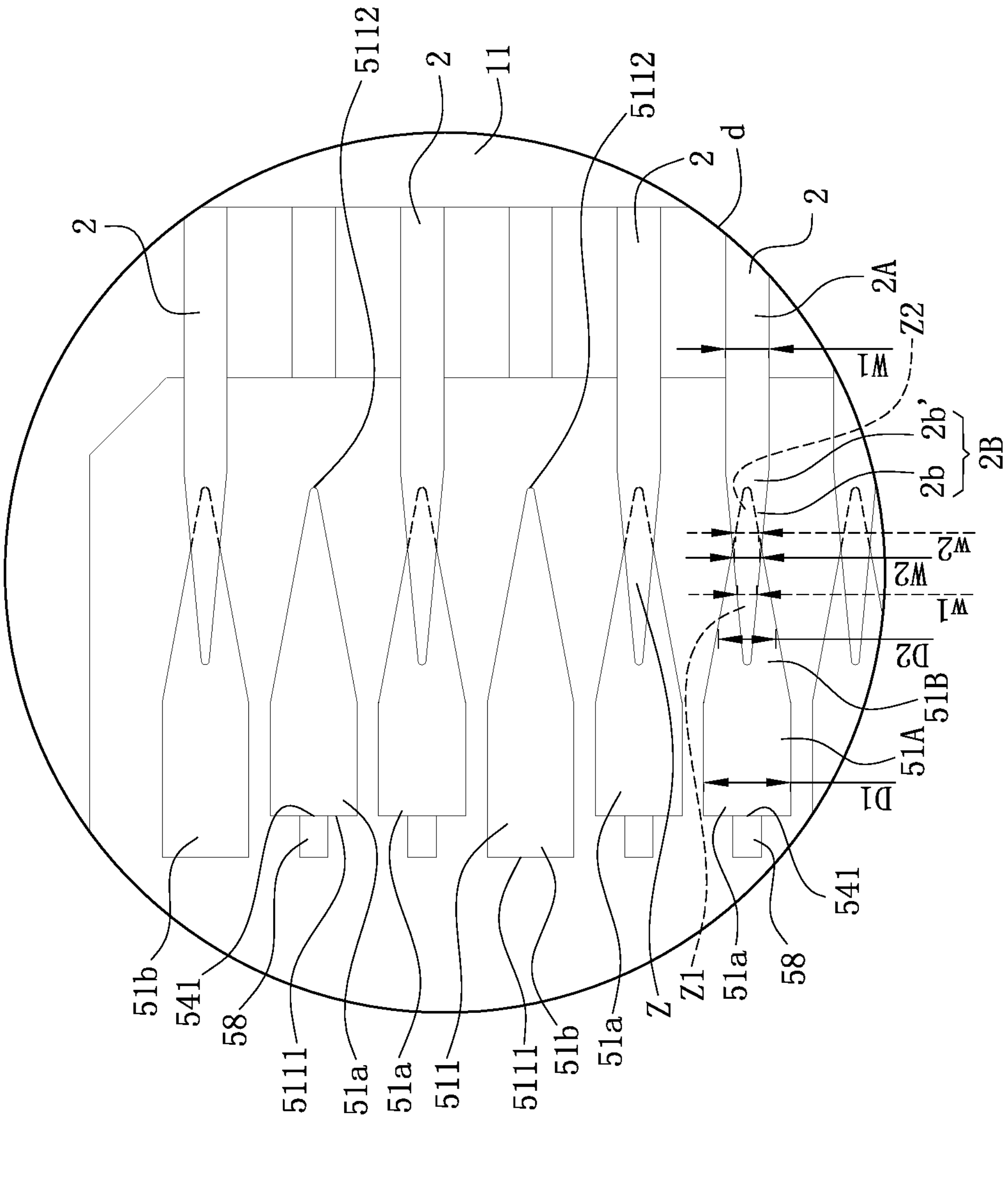
FIG. 17 is an enlarged view of a part d in FIG. 16.
Figure 18:
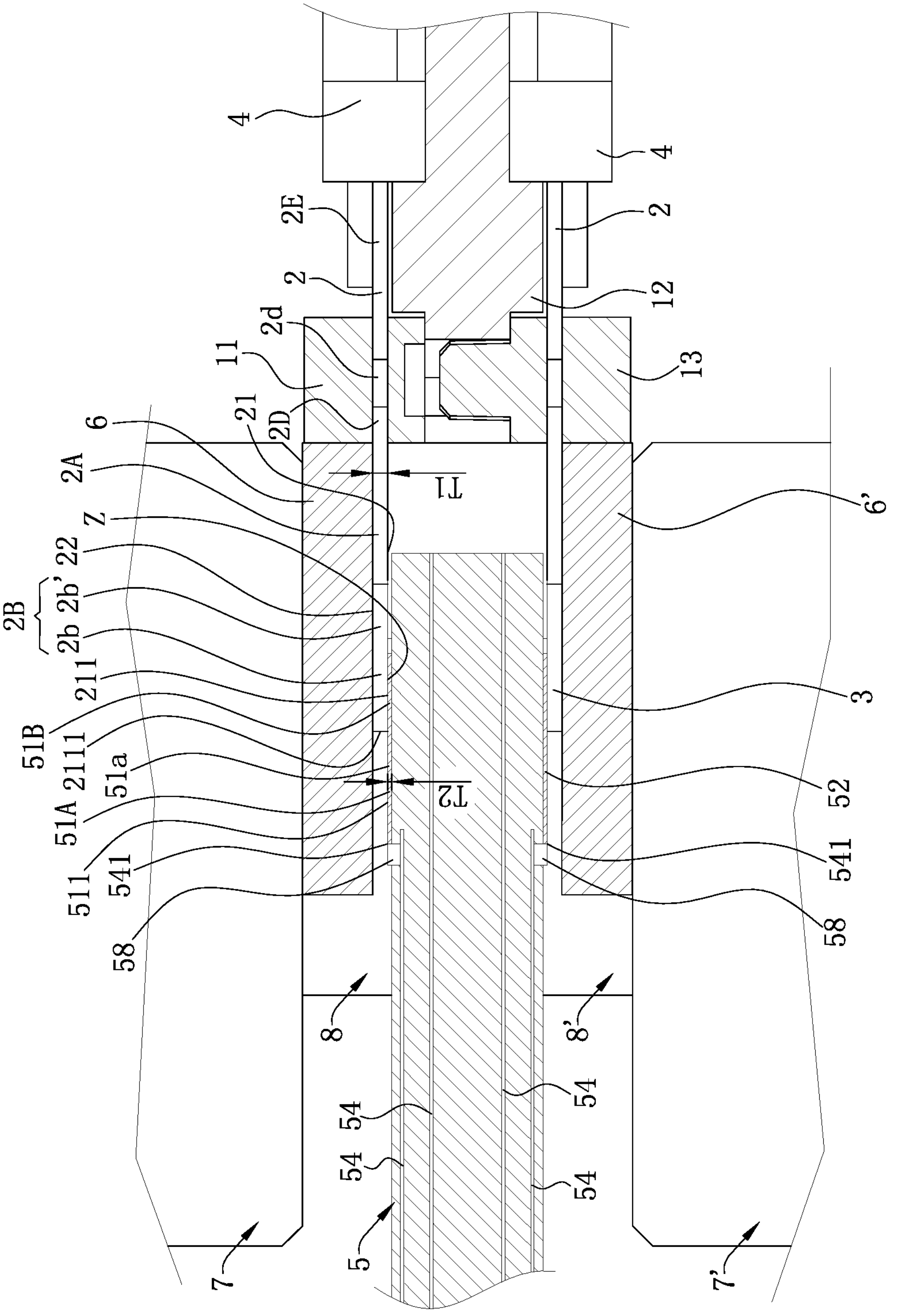
FIG. 18 is a schematic view of the electrical connection device in mating according to the second embodiment of the present invention.
Figure 19:
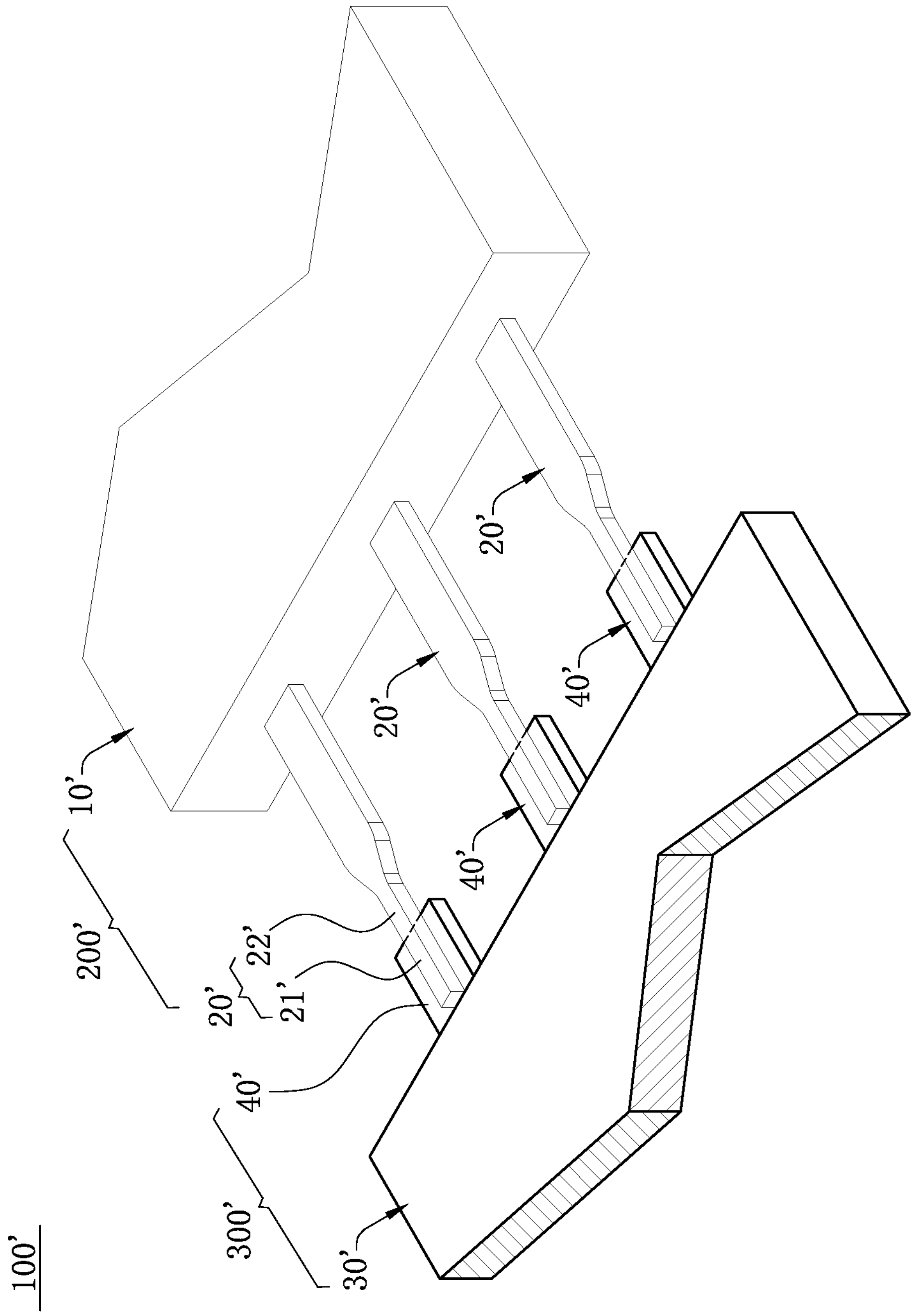
FIG. 19 is a three-dimensional view of an existing electrical connection device in mating.
Figure 20:
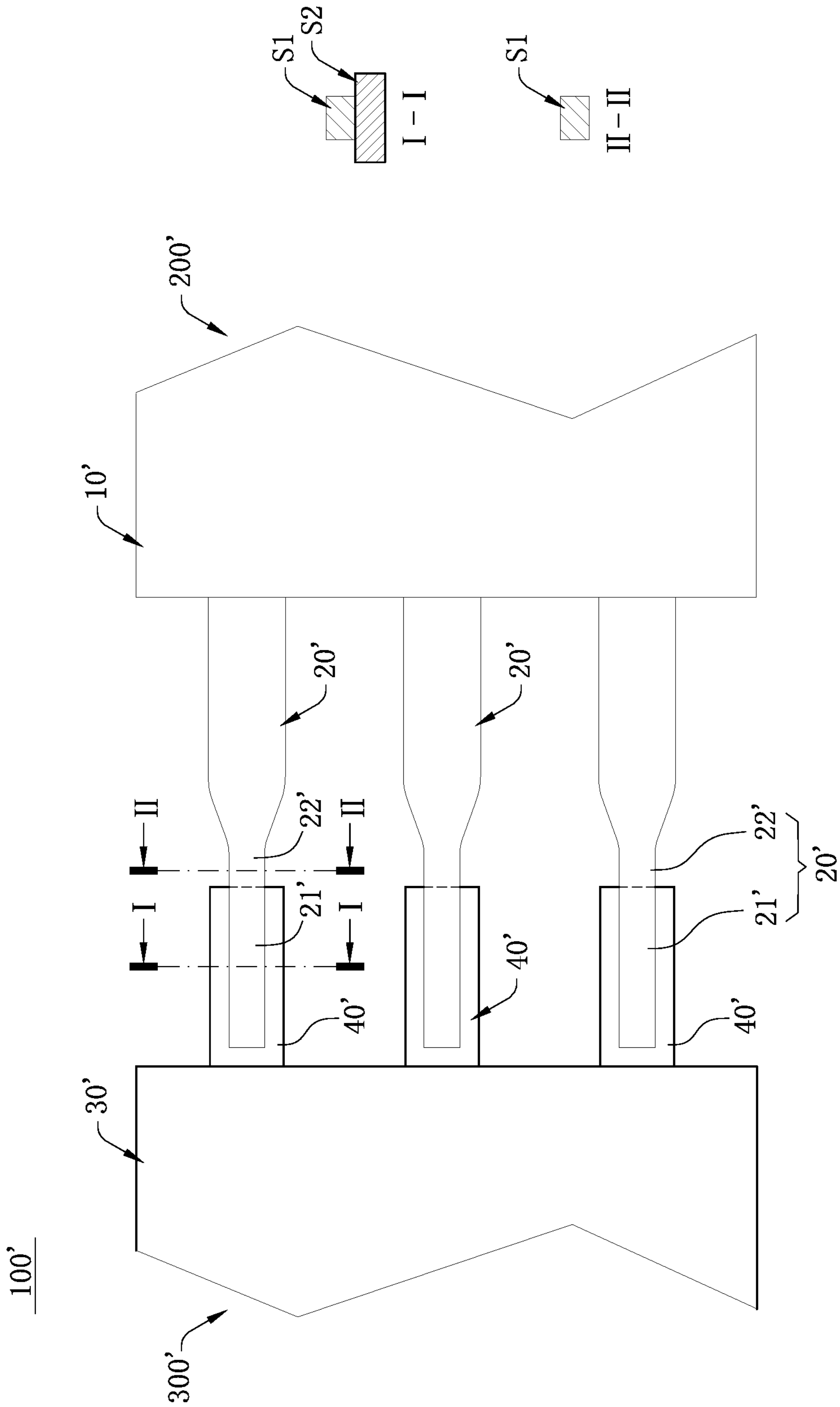
FIG. 20 is a top view of the electrical connection device in FIG. 19.

As shown in FIG. 1, FIG. 4 and FIG. 12, an electrical connection device 100 according to a first embodiment of the present invention includes: a first insulating body 1, formed by an upper body 11, a middle body 12, and a lower body 13; a plurality of strip-shaped first conductors 2 accommodated in the first insulating body 1, where each of the first conductors 2 is arranged horizontally and is configured to electrically connect backward with a first docking component 4; a second docking component 5, including a plurality of second conductors 51 located below the first conductors 2 and correspondingly docking with the first conductors 2 to transmit a high-frequency signal; an elastic body 6, located above the first conductors 2 and downwardly abutting the first conductors 2; and a pressing member 8, providing a downward acting force, such that the first conductors 2 downwardly abut the corresponding second conductors 51.

Figure 2:
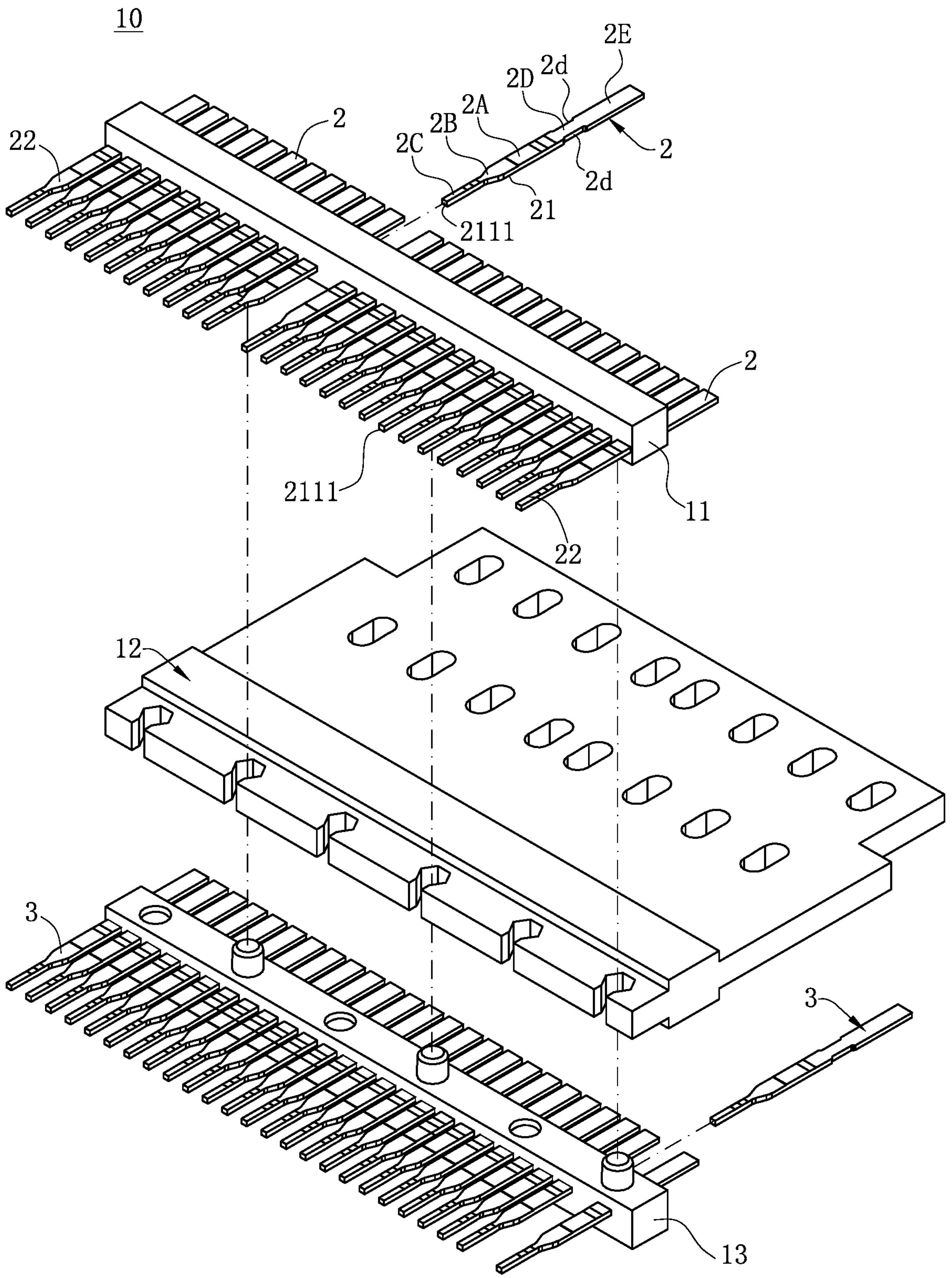
FIG. 2 is a local three-dimensional exploded view of the electrical connection device according to the first embodiment of the present invention.
Figure 3:
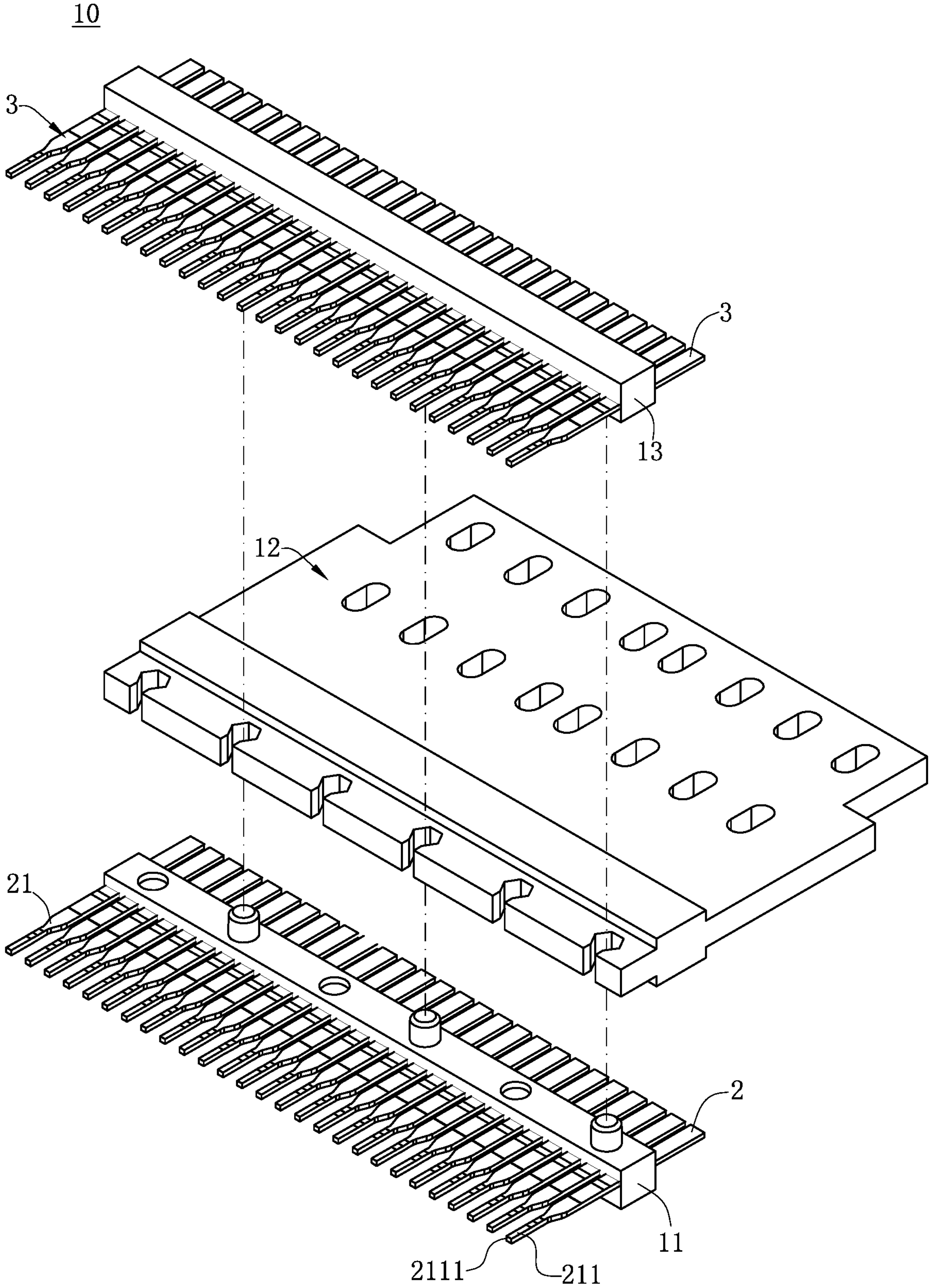
FIG. 3 is a local three-dimensional exploded view, viewed from another viewing angle, of the electrical connection device according to the first embodiment of the present invention.
Figure 7:
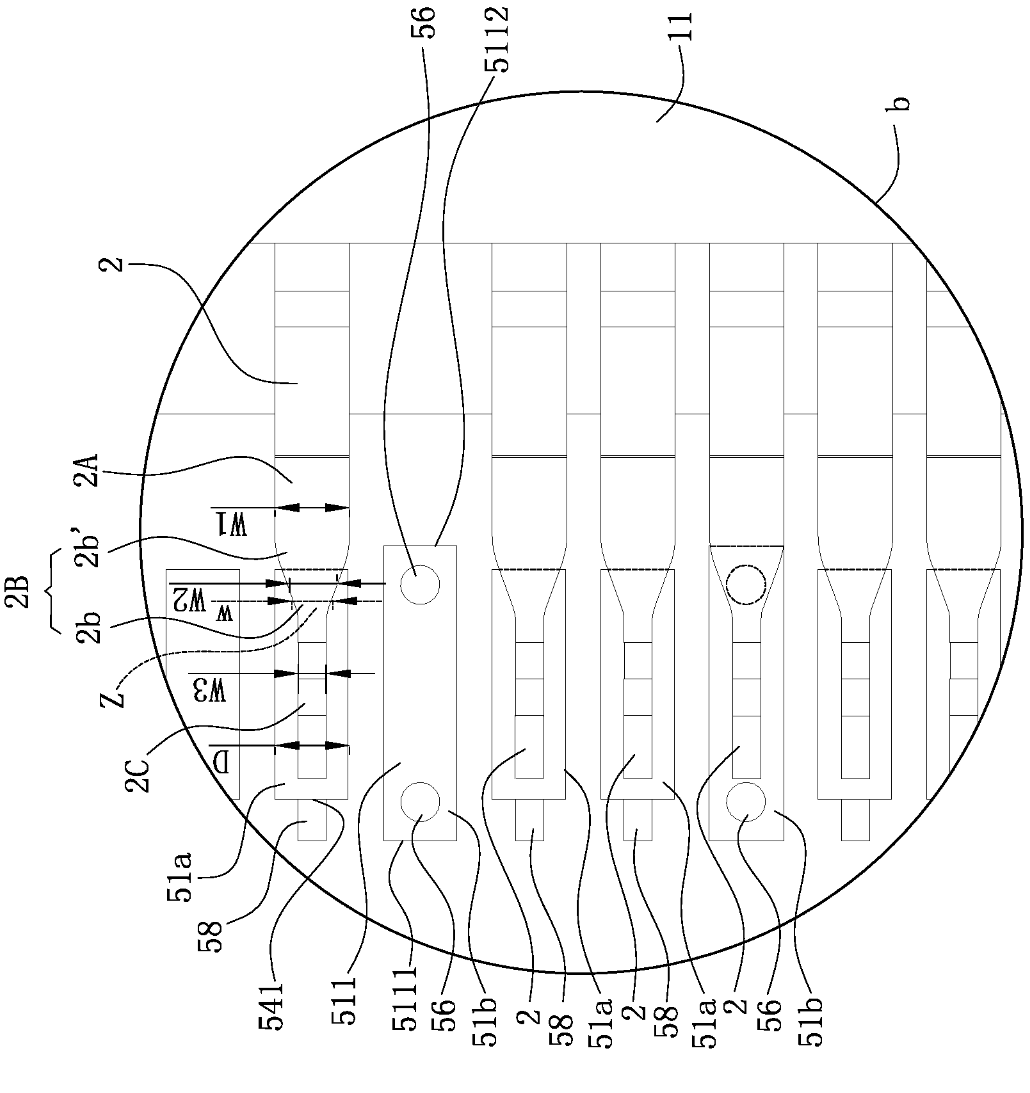
FIG. 7 is an enlarged view of a part b in FIG. 6.

As shown in FIG. 2, FIG. 7, and FIG. 12, the thickness T1 of the first conductor 2 is greater than the thickness T2 of the second conductor 51. Each of the first conductors 2 includes a first section 2A, a second section 2B, a third section 2C, a fixed section 2D and a conducting section 2E having an identical thickness. The width W1 of the first section 2A is constant. The first section 2A is exposed in front of the upper body 11, and the first section 2A is located behind the second conductor 51 and does not abut the second conductor 51. The width W1 of the first section 2A is equal to the width D of the second conductor 51. The second section 2B is formed by extending forward from the first section 2A. The width W2 of the second section 2B gradually decreases from the rear to the front. The second section 2B includes a contact portion 2*b* and a connecting portion 2*b*' located between the contact portion 2*b* and the first section 2A and connecting the contact portion 2*b* and the first section 2A. A width of a rear end of the connecting portion 2*b*' is equal to a width of a front end of the first section 2A, and a width of a front end of the connecting portion 2*b*' is equal to a width of a rear end of the contact portion 2*b*. The contact portion 2*b* abuts the corresponding second conductor 51 to form a contact surface Z. The width w of the contact surface Z on the second section 2B gradually decreases forward, and the connecting portion 2*b*' is located behind the corresponding second conductor 51 and does not abut the second conductor 51. In other embodiments, the contact portion 2*b* and the connecting portion 2*b*' may both abut the corresponding second conductor 51. The third section 2C is formed by extending forward from the contact portion 2*b*. The width W3 of the third section 2C is constant. The width W3 of the third section 2C is ⅓ of the width D of the second conductor 51, and the entire third section 2C abuts the corresponding second conductor 51. The fixed section 2D is formed by extending backward from the first section 2A. A groove 2*d* is concavely formed at each of the left and right sides of the fixed section 2D, and the upper body 11 covers the grooves 2*d* to fix the fixed section 2D to the upper body 11. The conducting section 2E is formed by extending backward from the fixed section 2D, and the conducting section 2E is exposed behind the upper body 11 and electrically connected to the first docking component 4.

Figure 5:
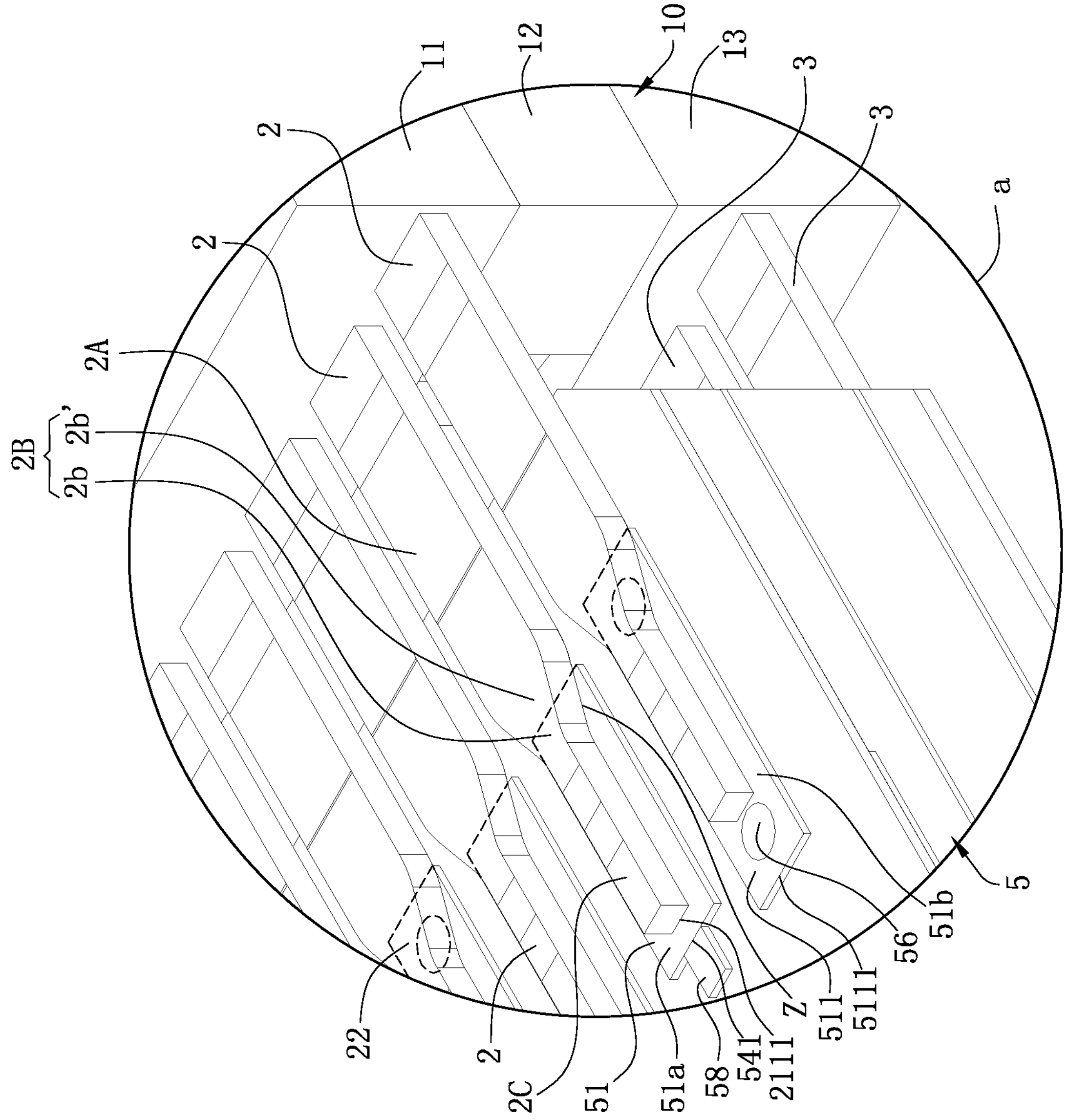
FIG. 5 is an enlarged view of a part a in FIG. 4.
Figure 6:
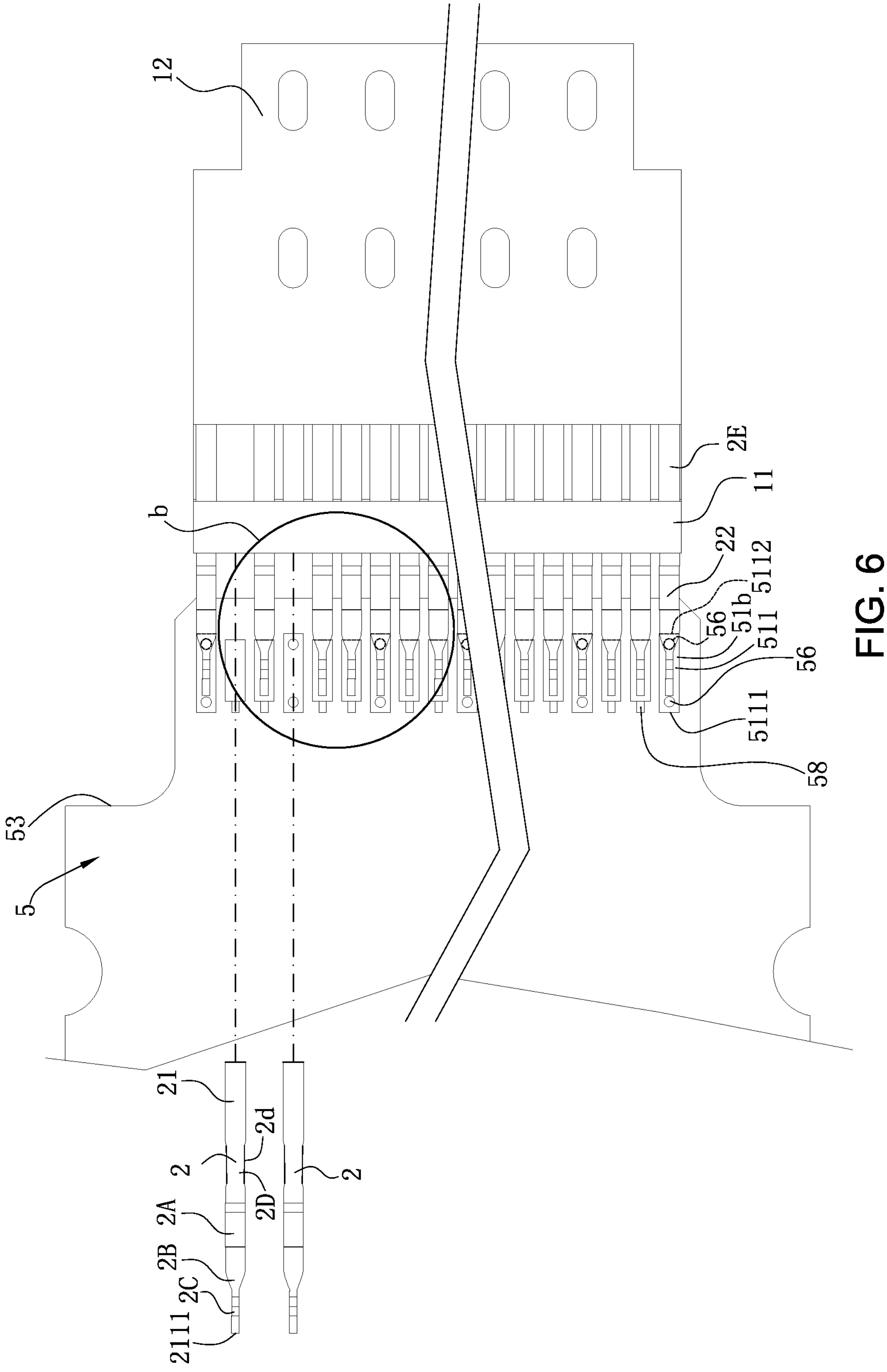
FIG. 6 is a local top view of the electrical connection device according to the first embodiment of the present invention.

As shown in FIG. 5, FIG. 7 and FIG. 12, a bottom surface 21 of each of the first conductors 2 has a front edge 2111. In other embodiments, the front edge 2111 can be a curve or a polyline. A contact area 211 extends backward from the front edge 2111. Each of the second conductors 51 has a front end 5111 and a rear end 5112 opposite to each other and a top surface 511 connecting the front end 5111 and the rear end 5112. An insulating member 7 is located between the elastic body 6 and the pressing member 8 and downwardly abuts the elastic body 6. The pressing member 8 provides a downward pressing force to downwardly abut the insulating member 7, such that the insulating member 7 presses the elastic body 6. In other words, the pressing member 8 presses the elastic body 6 indirectly through the insulating member 7. The elastic body 6 simultaneously presses the first section 2A, the second section 2B and the third section 2C, such that the first conductor 2 forms a close contact with the corresponding second conductor 51. The contact area 211 is completely attached to the top surface 511. The front edge 2111 is located between the front end 5111 and the rear end 5112, and abuts the top surface 511. The rear end 5112 abuts the contact area 211. An area 22 of the first conductor 2 pressed by the elastic body 6 extends to be right above the front edge 2111. The contact area 211 is narrow at a front and wide at a rear thereof. The width W3 of the front edge 2111 is ⅓ of the width D of the front end 5111.

As shown in FIG. 5, FIG. 7 and FIG. 12, when the pressing member 8 presses the elastic body 6, the first section 2A is located behind the second conductor 51 and does not abut the second conductor 51, and the contact portion 2*b* and the third section 2C simultaneously downwardly abut the second conductor 51, such that the cross-sectional area (i.e., W2×T1+D×T2) of the abutting location of the contact portion 2*b* and the second conductor 51 gradually decreases in a direction from the rear to the front. That is, the cross-sectional area (i.e., W2×T1+D×T2) of the abutting location of the contact portion 2*b* and the second conductor 51 gradually decreases relative to the cross-sectional area (i.e., W1×T1) of the first section 2A, and is finally equal to the cross-sectional area (i.e. W3×T1+D×T2) of the abutting location of the third section 2C and the second conductor 51, thereby ensuring that in the process where the high-frequency signal is transmitted from the first section 2A to the second conductor 51 via the second section 2B and the third section 2C, the high-frequency signal fluctuates more gently, instead of fluctuating instantaneously and severely, thus improving the transmission quality of the high-frequency signal.

Figure 8:
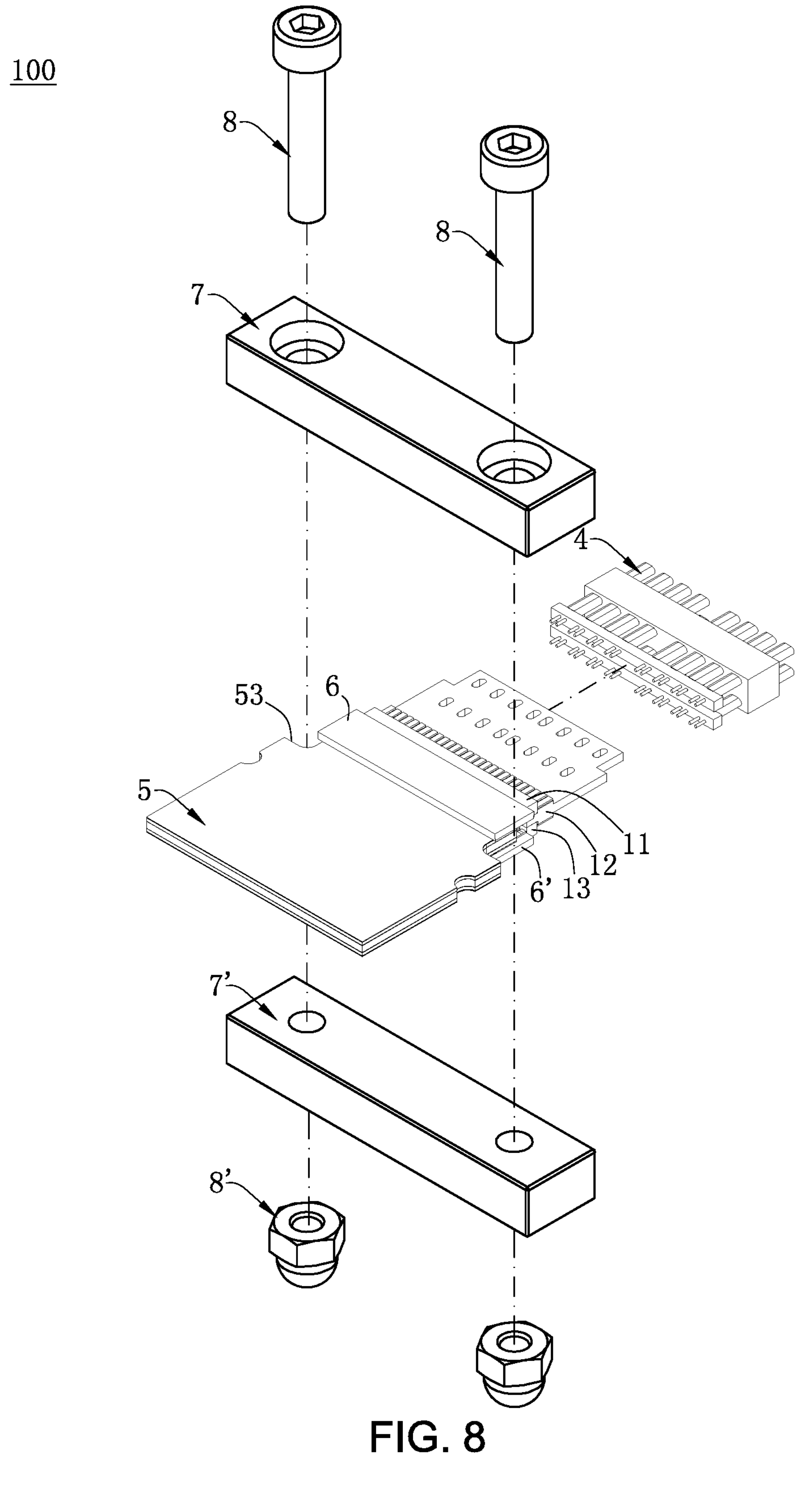
FIG. 8 is another three-dimensional exploded view of the electrical connection device according to the first embodiment of the present invention.
Figure 9:
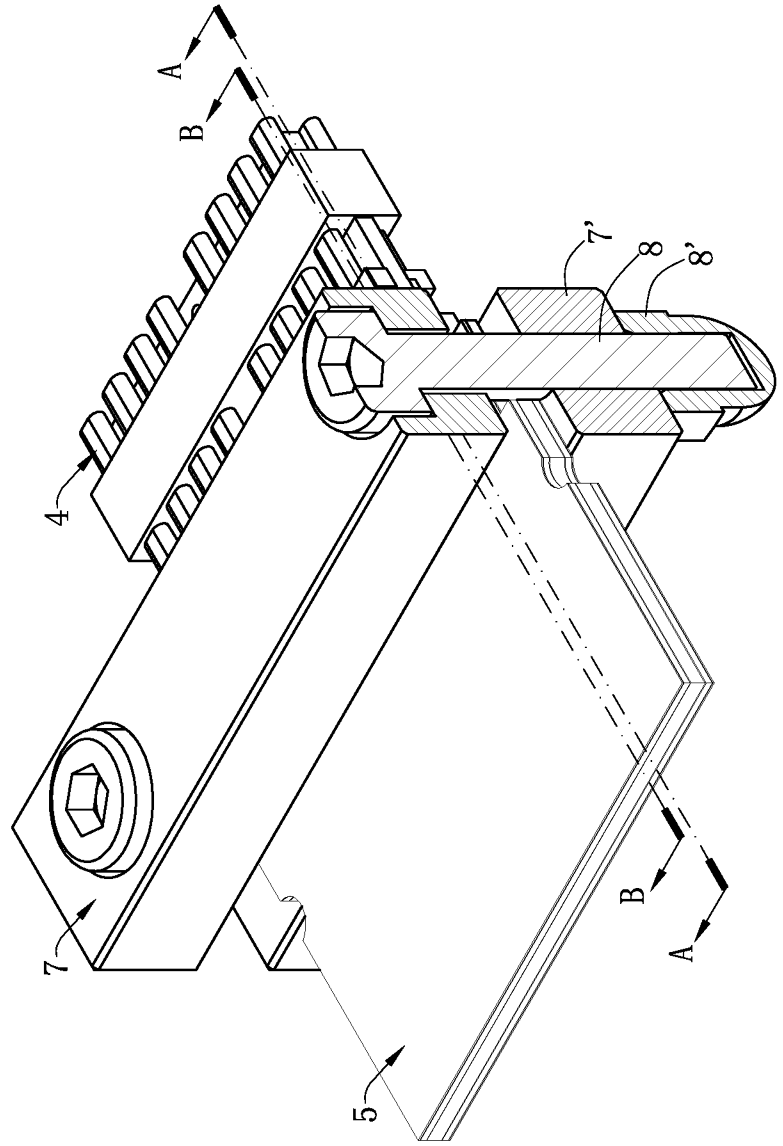
FIG. 9 is a three-dimensional assembled view of the electrical connection device according to the first embodiment of the present invention and a first docking component.
Figure 10:
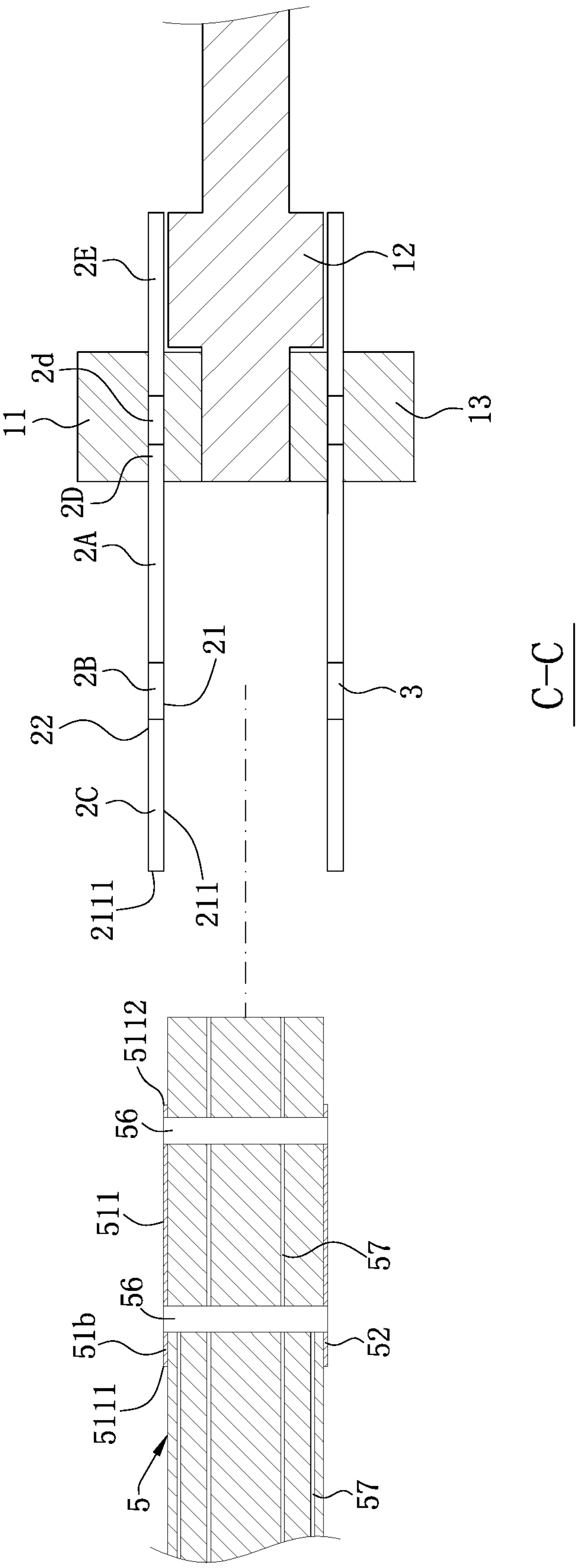
FIG. 10 is a local side sectional view of the electrical connection device according to the first embodiment of the present invention along a C-C direction.
Figure 11:
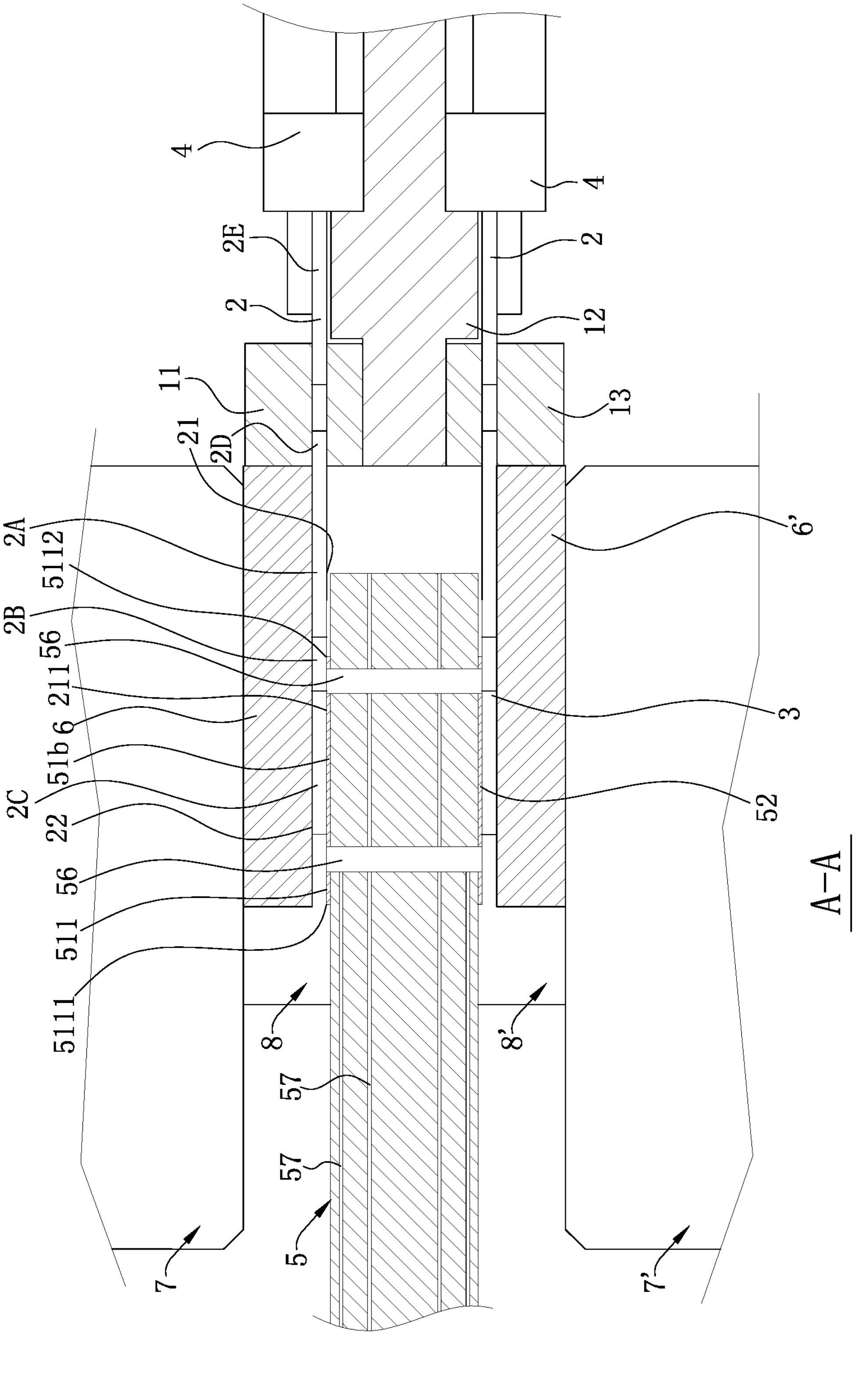
FIG. 11 is a side sectional view of the electrical connection device according to the first embodiment of the present invention along an A-A direction.

As shown in FIG. 8, FIG. 9 and FIG. 12, an elastic component 6' is located below a plurality of third conductors 3 and upwardly abuts the third conductor 3. An insulating block 7' upwardly abuts the elastic component 6'. A pressing component 8' provides an upward acting force to abut the insulating block 7', such that the third conductors 3 upwardly abut a plurality of fourth conductors 52 correspondingly. The pressing member 8 is a screw bolt passing through the insulating member 7 and the insulating block 7' from top to bottom, and the pressing component 8' is a screw nut matching with the screw bolt. The second docking component 5 has a notch 53 spaced away from the pressing member 8.

As shown in FIG. 1, FIG. 2 and FIG. 12, the third conductors 3 and the first conductors 2 are structurally identical and are symmetrically provided in a vertical direction. For the structure of the third conductors 3, reference may be made to the structure of the first conductors 2, and thus are not elaborated herein. The first conductors 2 and the third conductors 3 are fixed to the first insulating body 1 to form an electronic component 10, and the electronic component 10 is electrically connected to the first docking component 4 and the second docking component 5. In other embodiments, one first conductor 2 and one third conductor 3 may be respectively provided. The second conductors 51 and the fourth conductors 52 are structurally identical and are symmetrically provided in a vertical direction. In other embodiments, one second conductor 51 and one fourth conductor 52 may be provided.

The elastic body 6 and the elastic component 6' are made of a material with good elasticity, such as rubber. The elastic body 6 can elastically press the first conductors 2 without damaging the first conductors 2, and the elastic component 6' can elastically press the third conductors 3 without damaging the third conductors 3. Preferably, the elastic body 6 and the elastic component 6' are silicone rubbers.

As shown in FIG. 4, FIG. 5, FIG. 11 and FIG. 12, the second docking component 5 is a circuit board. The second conductors 51 include a plurality of signal pads 51*a* and a plurality of grounding pads 51*b*. The circuit board has a signal wire 54 and a connecting member 58 electrically connected to the signal wire 54 corresponding to each of the signal pads 51*a*, and the connecting member 58 has a connection point 541 conductively connected to the signal pad 51*a*. In a horizontal projection, the connection point 541 is located between the front end 5111 and the front edge 2111. Preferably, the connection point 541 is conductively connected to the front end 5111, and the top surface of the connecting member 58 is flush with the top surface of the corresponding signal pad 51*a*. The circuit board is provided with at least one accommodating hole 55 corresponding to each of the grounding pads 51*b*. A conducting member 56 is correspondingly accommodated in each accommodating hole 55. The grounding pads 51*b* and the fourth conductors 52 are electrically connected to each other via the conducting member 56, and the conducting member 56 is located directly below the contact area 211. Further, the accommodating hole 55 upwardly passes through the grounding pads 51*b*, such that the conducting member 56 is exposed to the top surface 511 and abuts the contact area 211. The conducting member 56 is located between the front edge 2111 and the front end 5111. The circuit board has at least one grounding wire 57 corresponding to each of the grounding pads 51*b*. The conducting member 56 is electrically connected to the corresponding grounding wires 57. The quantity of the grounding wires 57 is four, and in other embodiments, the quantity of the grounding wires 57 can be other numbers.

The conducting member 56 is made of a material having good electrical conductivity, such as a solid copper cylinder or a hollow copper-coated layer. The quantity of the conducting members 56 is two. In other embodiments, the quantity of the conducting member 56 can be one, or there can be more than two conducting members 56. Alternatively, the grounding wires 57 can be directly electrically connected to the grounding pads 51*b* without providing the conducting members 56.

In other embodiments, the first insulating body 1 can be made to be an integral one-piece. In other words, the upper body 11, the middle body 12 and the lower body 13 are formed integrally by injection molding.

In certain embodiments, the pressing member 8 and the pressing component 8' be other pressing components (not shown in the drawings) rather than a screw bolt and a screw nut, and an even be made to be one-piece rather than separable from each other. The pressing member 8 can directly press the elastic body 6 without providing the insulating member 7, and the pressing component 8' can directly press the elastic component 6' without providing the insulating block 7'.

The second docking component 5 can be other docking component (not shown in the drawings), such as a male connector (not shown in the drawings), rather than a circuit board.

FIG. 13 to FIG. 18 show an electrical connection device 100 according to a second embodiment of the present invention. The structures in this embodiment having the same reference numerals as those in the first embodiment will not be elaborated herein in this embodiment. Compared with the electrical connection device 100 according to the first embodiment, this embodiment mainly has the following differences. The first conductor 2 is not provided with a third section. The second conductor 51 includes a first portion 51A and a second portion 51B extending backward from the first portion 51A. A thickness of the first portion 51A is equal to a thickness of the second portion 51B. The width D1 of the first portion 51A is constant. The width D2 of the second portion 51B gradually decreases in a direction from the front to the rear, and a width of a front end of the second portion 51B is equal to a width of a rear end of the first portion 51A. The width W1 of the first section 2A is less than the width D1 of the first portion 51A, and the thickness T1 of the first section 2A is greater than the thickness T2 of the first portion 51A, such that the cross-sectional area (i.e. W1×T1) of the first section 2A is equal to the cross-sectional area (i.e. D1×T2) of the first portion 51A.

Since the width D1 of the first portion 51A is constant, the width D2 of the second portion 51B gradually decreases in the direction from the front to the rear, the width W1 of the first section 2A is constant and the width W2 of the second section 2B gradually decreases from the rear to the front, when the pressing member 8 presses the elastic body 6, the first portion 51A is located in front of the second section 2B and does not abut the second section 2B. The first section 2A is located behind the second portion 51B and does not abut the second portion 51B, and the contact portion 2*b* downwardly abuts the second portion 51B to form the contact surface Z. The contact surface Z includes a first contact surface Z1 and a second contact surface Z2 connected to each other. The width w1 of the first contact surface Z1 on the second section 2B gradually decreases forward, and the width w2 of the second contact surface Z2 on the second section 2B gradually decreases backward, such that the cross-sectional area (i.e., W2×T1+D2×T2) of the abutting location of the second portion 51B and the contact portion 2*b* from the rear to the front is equal to the cross-sectional area (i.e., W1×T1) of the first section 2A and also equal to the cross-sectional area (i.e., D1×T2) of the first portion 51A, thereby ensuring that in the process where the high-frequency signal is transmitted from the first section 2A sequentially to the second portion 51B and the first portion 51A via the second section 2B, the high-frequency signal does not fluctuate, thus ensuring the transmission quality of the high-frequency signal to the utmost extent.

The electrical connection device according to certain embodiments of the present invention have the following beneficial effects:

(1) Since the width W1 of the first section 2A is constant and the width W2 of the contact portion 2*b* of the second section 2B gradually decreases in the direction from the rear to the front, when the pressing member 8 presses the elastic body 6, the first section 2A is located behind the second conductor 51 and does not abut the second conductor 51. The contact portion 2*b* abuts the second conductor 51 to form the contact surface Z, and the width of the contact surface Z on the second section 2B gradually decreases, such that the cross-sectional area (i.e., W2×T1+D×T2) of the abutting location of the contact portion 2*b* and the second conductor 51 gradually decreases from the rear to the front. That is, the cross-sectional area (i.e., W2×T1+D×T2) of the abutting location of the contact portion 2*b* and the second conductor 51 gradually decreases relative to the cross-sectional area (i.e., W1×T1) of the first section 2A, thereby ensuring that in the process where the high-frequency signal is transmitted from the first section 2A to the second conductor 51 via the second section 2B, the high-frequency signal fluctuates more gently, instead of fluctuating instantaneously and severely, thus improving the transmission quality of the high-frequency signal.

(2) Since the width D1 of the first portion 51A is constant, the width D2 of the second portion 51B gradually decreases in the direction from the front to the rear, the width W1 of the first section 2A is constant and the width W2 of the second section 2B gradually decreases from the rear to the front, when the pressing member 8 presses the elastic body 6, the first portion 51A is located in front of the second section 2B and does not abut the second section 2B. The first section 2A is located behind the second portion 51B and does not abut the second portion 51B, and the contact portion 2*b* downwardly abuts the second portion 51B to form the first contact surface Z1 and the second contact surface Z2, such that the cross-sectional area (i.e., W2×T1+D2×T2) of the abutting location of the second portion 51B and the contact portion 2*b* from the rear to the front is equal to the cross-sectional area (i.e., W1×T1) of the first section 2A and also equal to the cross-sectional area (i.e., D1×T2) of the first portion 51A, thereby ensuring that in the process where the high-frequency signal is transmitted from the first section 2A sequentially to the second portion 51B and the first portion 51A via the second section 2B, the high-frequency signal does not fluctuate, thus ensuring the transmission quality of the high-frequency signal to the utmost extent.

(3) The first conductors 2 are overall horizontal strip-shape structures. When the pressing member 8 presses the elastic body 6, the elastic body 6 simultaneously downwardly abuts the first section 2A, the second section 2B and the third section 2C, such that the second section 2B and the third section 2C are completely attached to the top surface of the second conductor 51, thereby ensuring that there is no open circuit formed by the branch between the second section 2B and third section 2C and the second conductor 51, thus ensuring the transmission quality of the high-frequency signal.

(4) The connecting member 58 abuts the front end 5111 of the second conductor 51, and the top surface of the connecting member 58 is flush with the top surface of the second conductor 51 to electrically connect the second conductor 51 and the signal wire 54, thereby ensuring that there is no open circuit formed by the branch between the second conductor 51, the connecting member 58 and the signal wire 54, thus ensuring the transmission quality of the high-frequency signal.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connection device, comprising:

an electronic component, comprising a first conductor, wherein the first conductor has a first section and a second section extending forward from the first section, the second section has a contact portion, and a width of the contact portion in an extending direction of the second section gradually decreases;

a docking component, comprising a second conductor conductively connected to the first conductor to transmit a high-frequency signal, wherein the first conductor is located above the second conductor, the contact portion abuts the second conductor, and the first section is located behind the second conductor; and a pressing member located above the first conductor, wherein the pressing member provides a downward acting force such that the contact portion downwardly abuts the second conductor.

2. The electrical connection device according to claim 1, wherein the second section has a connecting portion located between the contact portion and the first section and connecting the contact portion and the first section, and a width of the connecting portion in the extending direction of the second section gradually decreases.

3. The electrical connection device according to claim 2, wherein a width of a rear end of the connecting portion is equal to a width of a front end of the first section, a width of a front end of the connecting portion is equal to a width of a rear end of the contact portion, and a thickness of the first section is equal to a thickness of the second section.

4. The electrical connection device according to claim 1, wherein the first conductor further has a third section extending forward from the contact portion, and the third section is provided in a constant width and abuts the second conductor.

5. The electrical connection device according to claim 4, wherein the first section, the second section and the third section are located on a same horizontal plane.

6. The electrical connection device according to claim 4, wherein a width of the third section is ⅓ of a width of the second conductor.

7. The electrical connection device according to claim 1, wherein the docking component is a circuit board, the second conductor is a signal pad, and the docking component has a signal wire and a connecting member electrically connecting the signal wire and the second conductor.

8. The electrical connection device according to claim 7, wherein the connecting member abuts a front end of the second conductor, and a top surface of the connecting member is flush with a top surface of the second conductor.

9. The electrical connection device according to claim 1, wherein the second conductor has a first portion and a second portion extending backward from the first portion, a width of the second portion gradually decreases in an extending direction thereof, the contact portion abuts the second portion, and the first portion is located in front of the contact portion.

10. The electrical connection device according to claim 9, wherein a width of a front end of the second portion is equal to a width of a rear end of the first portion, and a thickness of the second portion is equal to a thickness of the first portion.

11. The electrical connection device according to claim 9, wherein a width of the first section is less than a width of the first portion, and a thickness of the first section is greater than a thickness of the first portion.

12. An electrical connection device, comprising:

an electronic component, comprising a first conductor, wherein the first conductor has a first section and a second section extending forward from the first section, and a width of the second section gradually decreases in an extending direction thereof; and a docking component, comprising a second conductor conductively connected to the first conductor to transmit a high-frequency signal, wherein the first conductor is located above the second conductor, the second section abuts the second conductor so as to form a contact surface, a width of the contact surface on the second section gradually decreases, and the first section is located behind the second conductor, wherein an elastic body is located above the first conductor and downwardly abuts the first conductor, a pressing member is located above the elastic body and provides a downward acting force such that the first conductor downwardly abuts the second conductor, and when the pressing member presses the elastic body, the elastic body downwardly abuts the second section, and the second section downwardly abuts the second conductor so as to form the contact surface.

13. The electrical connection device according to claim 12, wherein the electronic component further comprises a third conductor, the third conductor and the first conductor are structurally identical and are provided symmetrically in a vertical direction, the docking component further comprises a fourth conductor, and the fourth conductor and the second conductor are structurally identical and are provided symmetrically in the vertical direction.

14. The electrical connection device according to claim 13, further comprising:

an insulating member, located between the elastic body and the pressing member and downwardly abutting the elastic body, wherein the pressing member downwardly abuts the insulating member;

an elastic component, located below the third conductor and upwardly abutting the third conductor;

an insulating block, located below the elastic component and upwardly abutting the elastic component; and a pressing component, located below the insulating block and upwardly abutting the insulating block, such that the third conductor upwardly abuts the fourth conductor.

15. The electrical connection device according to claim 14, wherein the pressing member is a screw bolt and passes through the insulating member and the insulating block from top to bottom, and the pressing component is a screw nut matching with the screw bolt.

16. The electrical connection device according to claim 12, wherein the first conductor further has a third section extending forward from the second section, and the third section is provided in a constant width and abuts the second conductor.

17. The electrical connection device according to claim 12, wherein the docking component is a circuit board, the second conductor is a signal pad, and the docking component has a signal wire and a connecting member electrically connecting the signal wire and the second conductor.

18. The electrical connection device according to claim 17, wherein the connecting member abuts a front end of the second conductor, and a top surface of the connecting member is flush with a top surface of the second conductor.

19. The electrical connection device according to claim 12, wherein the second conductor has a first portion and a second portion extending backward from the first portion, a width of the second portion gradually decreases in an extending direction thereof, and the second section abuts the second portion so as to form the contact surface.

20. The electrical connection device according to claim 19, wherein the contact surface comprises a first contact surface and a second contact surface connected to each other, a width of the first contact surface on the second section gradually decreases forward, and a width of the second contact surface on the second section gradually decreases backward.

21. The electrical connection device according to claim 19, wherein a width of a front end of the second portion is equal to a width of a rear end of the first portion, and a thickness of the second portion is equal to a thickness of the first portion.

22. The electrical connection device according to claim 12, wherein a width of a rear end of the second section is equal to a width of a front end of the first section, and a thickness of the second section is equal to a thickness of the first section.

* * * * *